(12) United States Patent
Kim et al.

(10) Patent No.: US 7,885,138 B2
(45) Date of Patent: *Feb. 8, 2011

(54) THREE DIMENSIONAL TWISTED BITLINE ARCHITECTURE FOR MULTI-PORT MEMORY

(75) Inventors: Hoki Kim, San Ramon, CA (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 649 days.

This patent is subject to a terminal disclaimer.

(21) Appl. No.: 11/875,173

(22) Filed: Oct. 19, 2007

(65) Prior Publication Data

US 2009/0103390 A1 Apr. 23, 2009

(51) Int. Cl.
*G11C 8/00* (2006.01)
(52) U.S. Cl. .................. 365/230.05; 365/156; 365/207
(58) Field of Classification Search ............ 365/230.05, 365/154, 156, 189.07, 189.19, 207, 208
See application file for complete search history.

(56) References Cited

U.S. PATENT DOCUMENTS

| 5,418,750 | A | 5/1995 | Shiratake et al. | |
|---|---|---|---|---|
| 5,563,834 | A | 10/1996 | Longway et al. | |
| 5,594,279 | A | 1/1997 | Itou et al. | |
| 5,652,728 | A | 7/1997 | Hosotani et al. | |
| 5,773,892 | A | 6/1998 | Morikawa et al. | |
| 6,282,129 | B1 * | 8/2001 | Khoury et al. | 365/189.16 |
| 6,570,781 | B1 | 5/2003 | Lee et al. | |
| 6,845,059 | B1 | 1/2005 | Wordeman et al. | |
| 6,990,025 | B2 | 1/2006 | Kirihata et al. | |
| 7,286,437 | B2 * | 10/2007 | Kim et al. | 365/230.05 |

* cited by examiner

*Primary Examiner*—Gene N. Auduong
(74) *Attorney, Agent, or Firm*—Lisa Jaklitsch; Katherine S. Brown

(57) ABSTRACT

Embodiments of the present invention provide a memory array of dual part cells and design structure thereof. The memory array has a pair of twisted write bit lines and a pair of twisted read bit lines for each column. The twist is made by alternating the vertical position of each bit line pair in each section of a column, with the result of generating common mode nose and of reducing differential mode noise.

20 Claims, 9 Drawing Sheets

THREE DIMENSIONAL TWISTED BITLINE ARCHITECTURE FOR MULTI-PORT MEMORY

CROSS-REFERENCE TO RELATED APPLICATIONS

This application is related to a US patent application entitled "Three Dimensional Twisted Bitline Architecture for Multi-port Memory", to be issued as U.S. Pat. Ser. No. 7,286,437 on Oct. 23, 2007.

FIELD OF THE INVENTION

The present application is related to a multi-port memory architecture and related design structure thereof. More particularly, it relates to an improved architecture for a multi-port memory to enable a reliable differential sensing by creating a common noise while canceling the coupling level.

BACKGROUND OF THE INVENTION

Single port memory allows either a read or a write operation for each cycle time. Typically, the single port memory uses either 6 transistor static memory cells (6T SRAM) or a single 1-transistor dynamic cell (1T). FIG. 1-A shows a transistor level schematic for the typical 6T SRAM cell 0. It consists of four NMOS transistors 1, 2, 5 and 6, and two PMOS transistors 3 and 4. The PMOSs 3 and 4 and NMOSs 5 and 6 configure a CMOS cross-coupled latch, which maintains a data bit as a storage element. The NMOSs 1 and 2 are used to couple the nodes 7 and 8 to the bitlines (BL and bBL) when a wordline WL is activated. This allows the data bit to be read or written from the BL and bBL. FIG. 1-B shows a transistor level schematic for a dynamic memory cell 10. It consists of one NMOS transistor 11 and capacitor 12 (1T DRAM cell). When a WL is activated, the NMOS 11 couples the capacitor 12 to the BL. This allows a data bit stored in the capacitor 12 to be read or written from BL.

Regardless of the 6T SRAM or 1T DRAM, only one WL per array can be activated either for a read or write. This is because activating two or more WLs causes a data contention on the common BL. In order to improve the array utilization, a high performance memory system requires a simultaneous read and write operation FIG. 2-A shows a transistor level schematic for a dual port static memory cell. It consists of four NMOS transistors 21, 22, 25 and 26, and two PMOS transistors 3 and 4. Unlike the 1 port SRAM cell, the gates of the NMOS switching transistors, 1A and 1B, couple to different wordlines WL0 and WL1. By activating two word lines, WL0 and WL1, a first memory cell coupling to the WL0 and a second memory cell coupling to the WL1 can be simultaneously read or written through BL0 and BL1 without having a data contention. In accordance with standard usage in the field, the phrase "simultaneously read or written" means 'during the same clock cycle'. As those skilled in the art are aware, activating WL0 (or WL1) will turn on all the counterpart transistors 21 (or 22) in the row. If the cell to be read and the cell to be written are in the same row, the state of the data will be undefined until the voltages within the cell have stabilized. One of the read and write operations will therefore be delayed according to a convention to avoid contaminating the data. Preferably, the write operation will be done first so that the read operation produces the current data.

FIG. 2B shows a transistor level schematic for a dual port dynamic memory cell. It consists of two NMOS switching transistors 14A and 14B, and one capacitor 16. Similar to the dual port static memory cell, the gates of NMOS switching transistors, 14A and 14B couple to the different wordlines WL0 and WL1. By activating two WL0 and WL1, the memory cell coupling to the WL0 and the memory cell coupling to the WL1 can be simultaneously read or written through BL0 and BL1 without having a data contention.

FIG. 3A shows a transistor level schematic of the 3T gain cell. The NMOS transistor 34 couples the storage node 32 to the write bitline WBL for a write operation, when the write wordline WWL goes high. The storage node 32 may preferably have a capacitor 35 to store the data bit. The data bit stored in a storage node 32 can be read out to the read bitline RBL when a read wordline RWL goes high. If the storage node 32 contains a high level, two NMOS transistors 31 and 33 are both on, discharging the RBL. If the storage node keeps a low voltage, the NMOS transistor 33 is off, keeping the RBL at the pre-charged voltage.

FIG. 3-B shows a transistor level schematic for the 2T gain cell. Similar to the 3T gain cell, the NMOS transistor 34 couples the storage node 32 to the write bitline WBL for a write operation, when the write wordline WWL goes high. The storage node 32 may preferably have a capacitor 35 to keep the data bit. Unlike the 3T gain cell, the read NMOS switching transistors 31 are eliminated. The source of the NMOS transistor 32 couples to the read wordline RWL. This thus allows a data bit read operation by measuring a NMOS 33 transistor resistance. A typical method is to apply a voltage between RBL and RWL. They are both high unless they are selected. To read the data bits, RWL goes low. If the data bit is low, the NMOS 33 is off, keeping the RBL at high level. If the data bit is high, the NMOS 33 is on, making the RBL go low. Regardless of the 3T gain cell or 2T gain cell discussed above, these cells also allow simultaneous read and write operations.

FIG. 4 shows a memory array architecture for the 3T gain cell which allows simultaneous read and write operations. A memory 40 consists of an array of 3T gain cells 42 arranged in a matrix. However, another memory cell, which has a read and write port, may be used.

The memory cells are controlled by their corresponding read wordline RWL, write wordline WWL, read bitline RBL, and write bitline WBL. The data bit on the RBL is sensed by the corresponding sense amplifier 43. The WBL is driven by the write driver circuit 44. It is assumed that the memory cells 42A and 42C are in a write mode by activating WWL0, and the memory cells 42B and 42D are in a read mode by activating RWL1, while disabling WWL1 and RWL0. The memory cell data bits in the cells 42B and 42D are read out to the RBL0 and RBL1. They are sensed by the corresponding sense amplifiers 43. A typical sense amplifier utilizes a reference voltage VREF, which allows discrimination between the voltage on the RBL corresponding to the case of reading either a 1 or a 0 from the memory cell. The memory cell data bits in the memory cells 42A and 42C are written through the WBL0 and WBL1. The WBL0 and WBL1 are driven by the corresponding write bitline drivers 44. Note that these read and write operation are simultaneously enabled, which causes a potential RBL and WBL coupling noise.

FIG. 5 shows a simplified RBL and WBL coupling noise model and simulated waveform. It is assumed that the data bit on the RBL1 is being sensed by utilizing the sense amplifier 43, while the adjacent WBL0 and WBL1 are driven by the write drivers 44 for a write mode. It is also assumed that a read bitline RBL1 is pre-charged to VDD through the PMOS 55.

Assuming that the gain cell stores a low data bit, the RBL should maintain VDD. However, when the WBLs go high or low, due to the coupling capacitor between RBL and WBLs, the RBL goes high or low depending on the WBL voltage swing. As shown in a simulation, this coupling noise is as large as 250 mV even if the PMOS load device is not disabled during the sensing operation. Over 250 mV coupling noise makes it difficult or potentially impossible for a simultaneous read and write operation.

RBL shielding techniques may be used to eliminate this coupling noise. However, this would increase the cell area significantly. Note that this WBL coupling noise to the RBL is a unique problem that results from enabling a simultaneous read and write operation. Note that a conventional BL twisting method is not applicable to cancel the noise, because of a single ended RBL and WBL configuration used in this array.

SUMMARY OF THE INVENTION

The present invention relates to a memory array architecture of multi-port cells that enables reliable differential sensing by creating common mode noise while simultaneously canceling the coupling level.

The memory array in an integrated circuit includes an array of dual-port memory cells arranged in rows and columns, each cell being connected to a read word line and at least one read bit line and a write word line and at least one write bit line; a read circuit connected to the at least one read bit line and a driver circuit connected to the at least one write bit line; in which the at least one read bit line includes two read bit lines disposed along columns in at least two sections of the memory array, the read lines in the at least two sections having opposite senses of reception of electromagnetic radiation, whereby the read circuit receives common mode noise from the at least one write bit line; and the at least one write bit line comprises two write bit lines disposed in at least two sections of the memory array, the at least two sections having opposite senses of transmission of electric current, whereby the read circuit receives a reduced differential mode noise from the write bit line.

Embodiments of the present invention provide a design structure, and a machine-readable medium thereupon stored the design structure. The design structure, when implemented, will create the memory array as described above.

Embodiments of the present invention also provide a pair of twisted bitlines for both the read bitlines and the write bitlines. The twist is made by alternating the vertical position of each bit line pair in each section of a column, with the result of generating common mode nose and of reducing differential mode noise.

DETAILED DESCRIPTION

Figure 6:
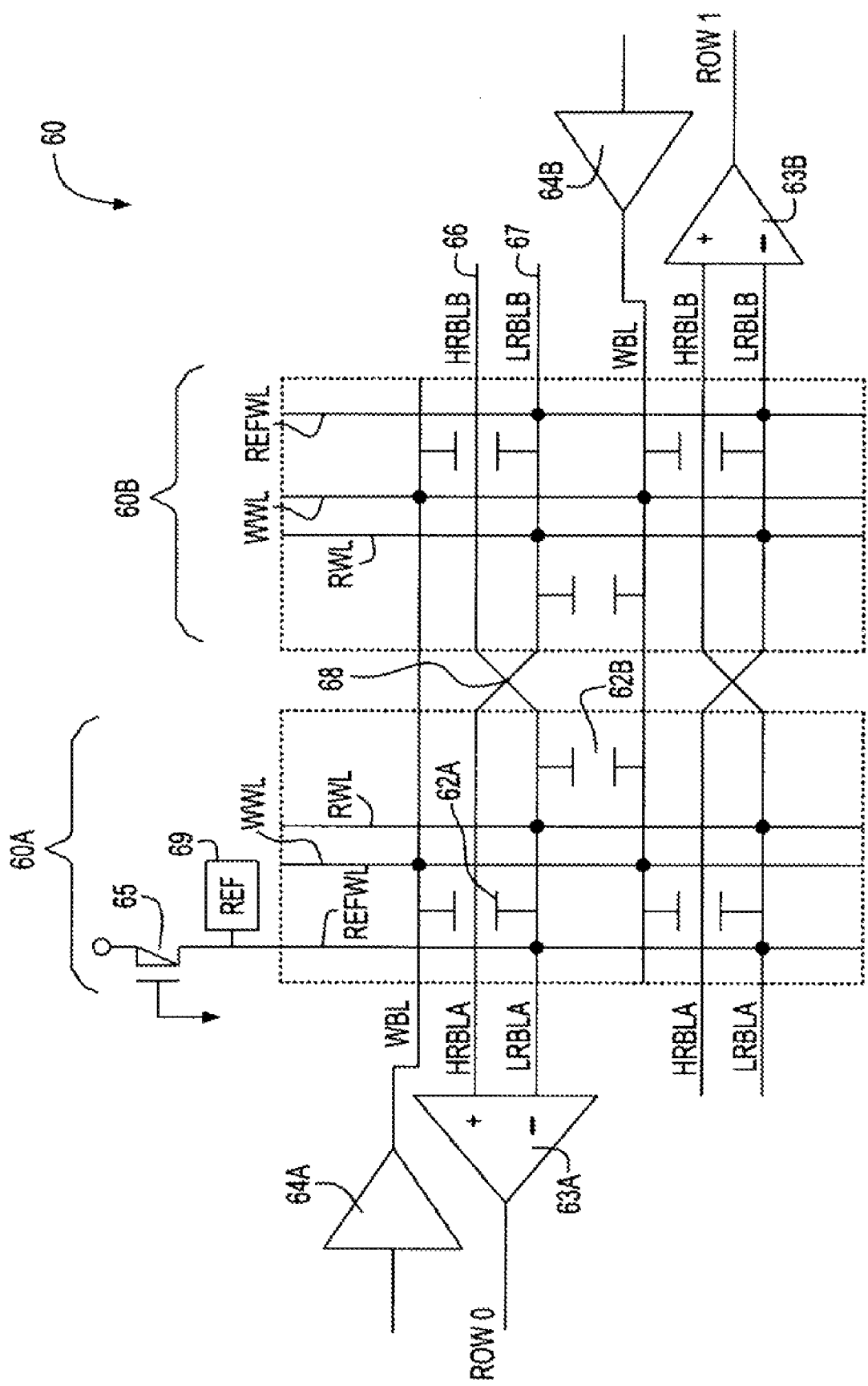
FIG. 6 shows an array with interleaved read bitlines for generation of common mode noise.

FIG. 6 shows a single memory array. Memory array 60 comprises a plurality of 3T gain cells arranged in a matrix. However, other memory cells, which have a read and write port, may be used to configure a memory array. The single memory array is divided into two memory sections 60A and 60B. Each WBL is extended into the two memory sections 60A and 60B. On the other hand, each RBL 67 in a same column is divided into two local RBL (LRBLA and LRBLB). Each memory column further contains hierarchical read bitlines 66 (HRBLA and HRBLB) that do not connect to the cells. They are arranged over the LRBLA and LRBLB in a different wiring layer. LRBLA and LRBLB (line 67) are coupled to the HRBLB and HRBLA (line 66) respectively by vertically twisting structure 68.

Figure 1A:
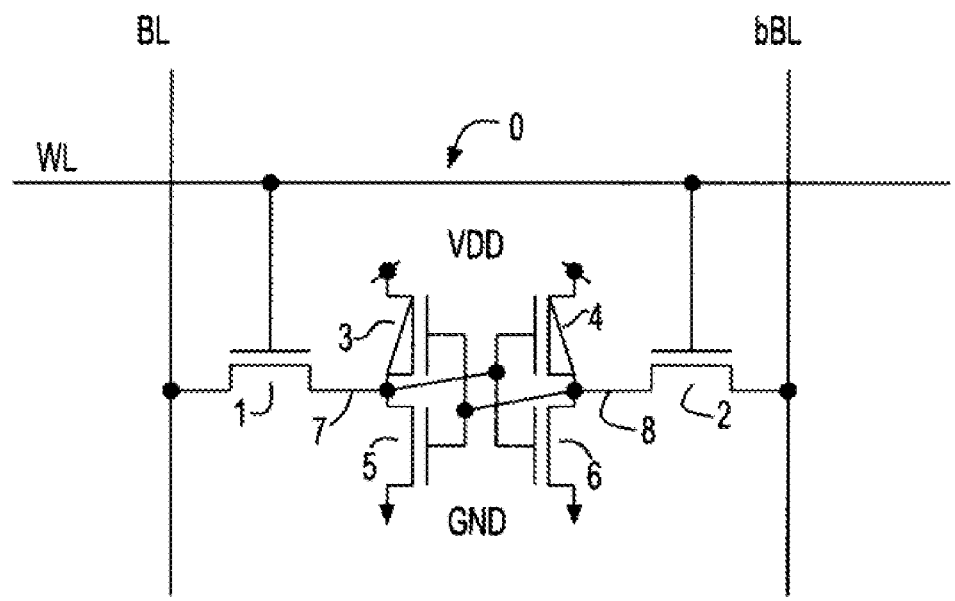
FIGS. 1A and 1B show prior art SRAM and DRAM cells.
Figure 1B:
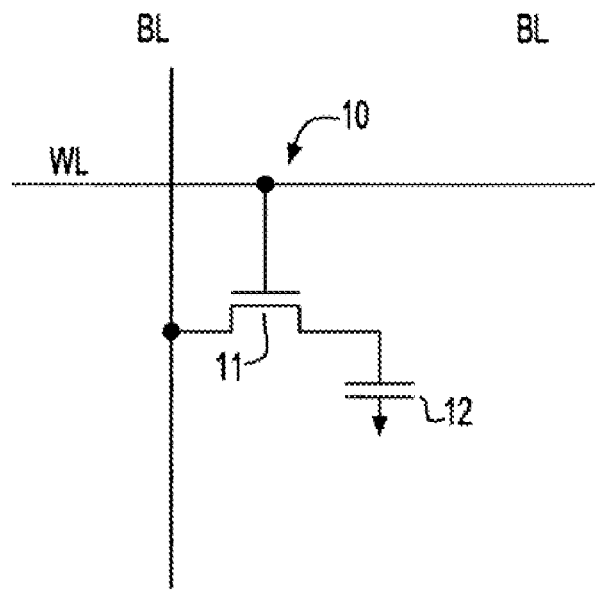
Figure 2A:
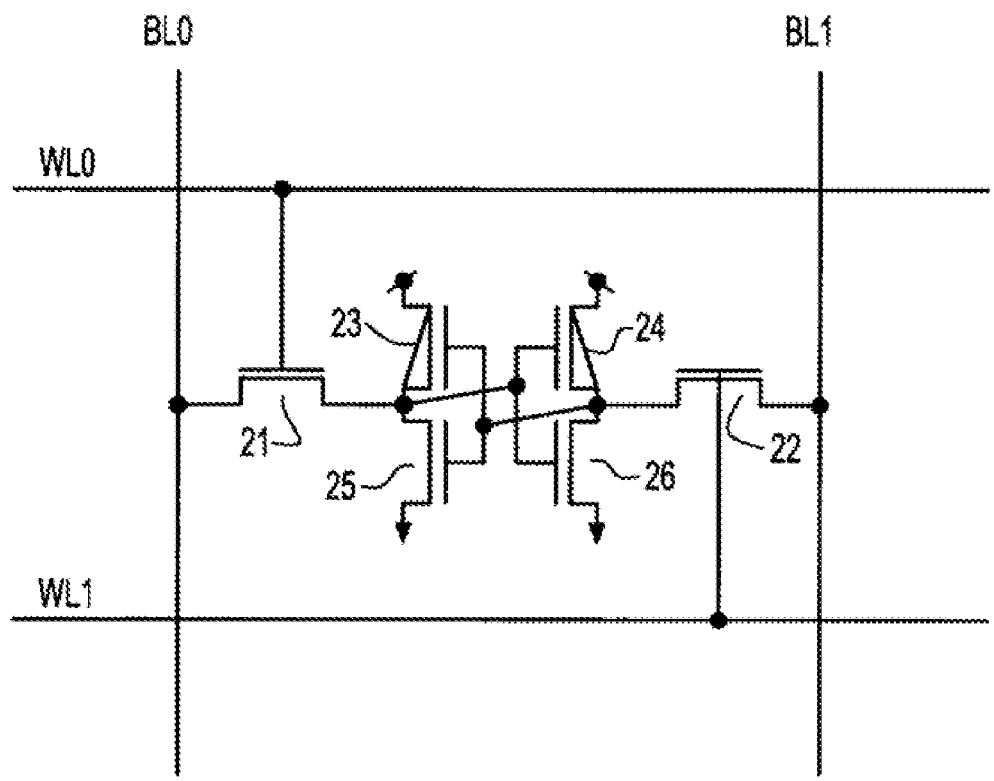
FIGS. 2A and 2B show prior art two-port SRAM and DRAM cells.
Figure 2B:
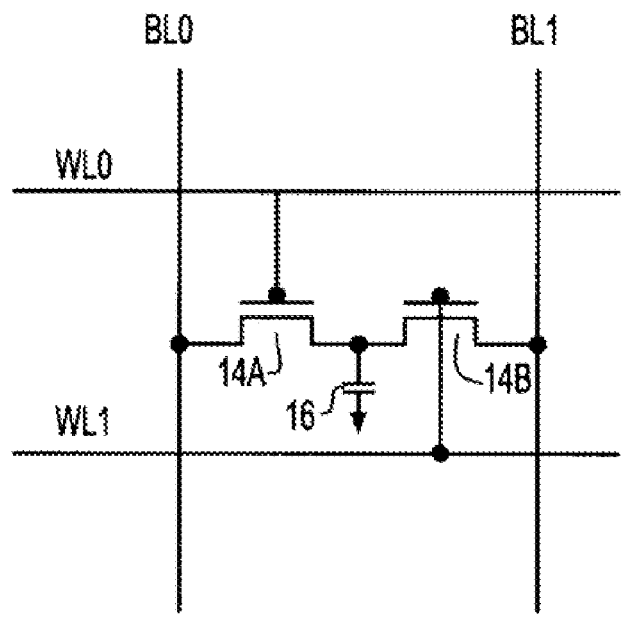
Figure 3A:
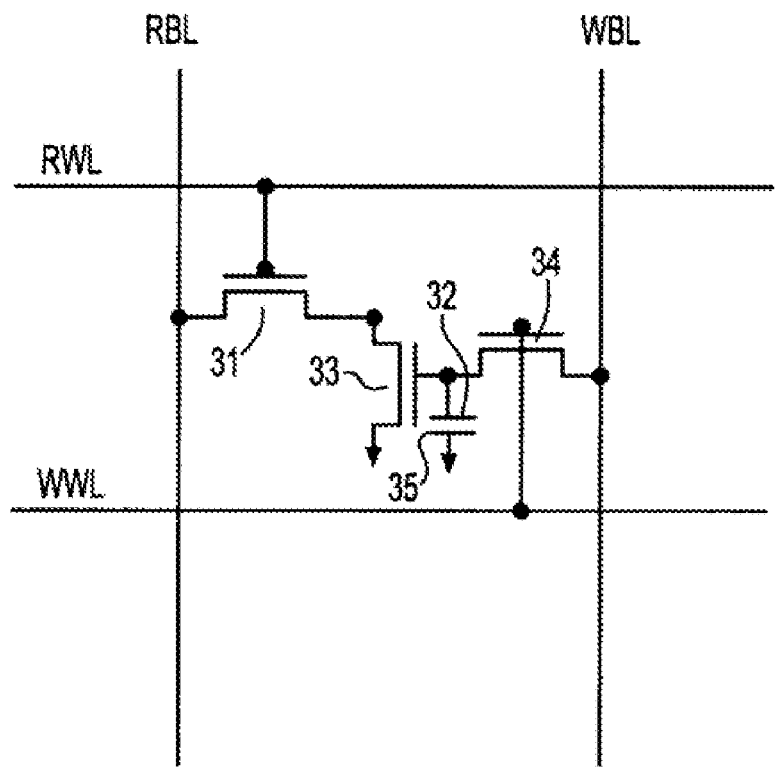
FIGS. 3A and 3B show alternative prior art DRAM cells.
Figure 3B:
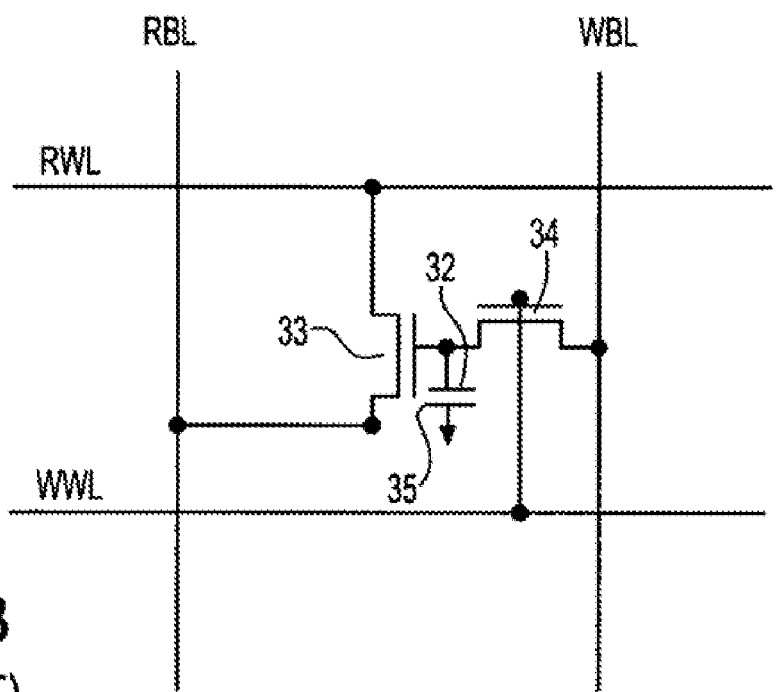
Figure 4:
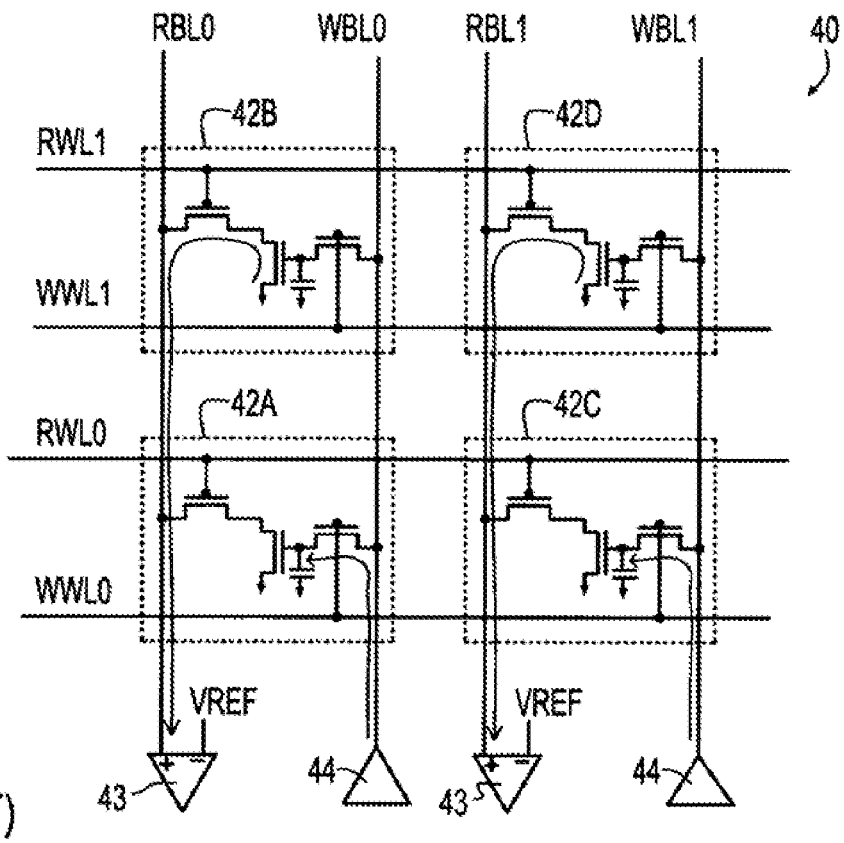
FIG. 4 shows a prior art array architecture.
Figure 5:
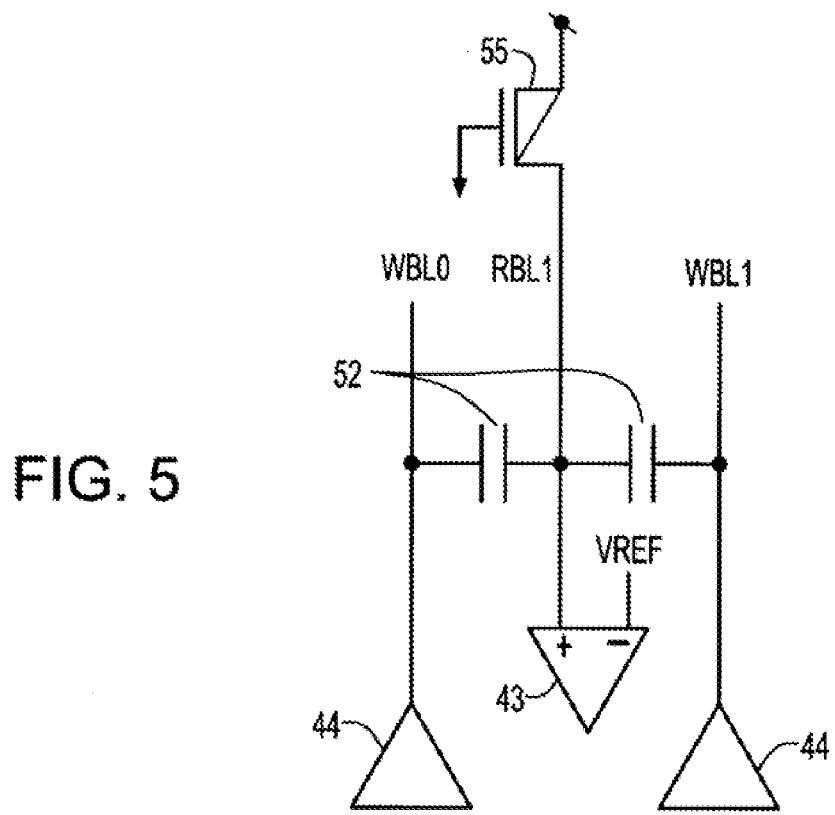
FIG. 5 shows a model of noise generation in an array.

The effect of the twisting structure 68 is that the two sections of the bit lines contribute equal and opposite signals to the sense amp; i.e. the two sections have opposite senses of reception in that the same field produces signals of opposite polarity in the two sections of the bit lines. The differential nature of reception of the sense amp input converts the opposite current flows to the same direction so that the received noise from the WBL cancels out on the two sides of the sense amp. The LRBLA and HRBLB in a row 0 are coupled to a differential sense amplifier 63A. The HRBLA occupies the input to the sense amplifier that would be used by a reference cell in the layout of FIG. 4.

Similarly, the LRBLA and HRBLB in a row 1 are coupled to a differential sense amplifier 63B. This interleaved sense amplifier arrangement makes it easy to accommodate sense amplifiers 63. Optionally, both SA 63A and 63B may be arranged only at the A or B side (or without interleaving them). Similar to the sense amplifiers, write driver arrangement 64A and 64B is also preferably interleaved. Optionally, both write drivers 64A and 64B may be arranged only at the A or B side (or without interleaving them). Each memory section A and B further contains a reference wordline REFWL coupling to reference cells 69. The reference cell located in this example is within the array not outside of the array. The crossing dot over refwl and LRBLA in FIG. 6 represents the reference cell. The reference cell concept and it's timing with regard to RWL is well known to those skilled in the art. The reference cells are connected to a reference voltage (VREF), so that when the reference cell is accessed, the RBL or RBLB which the reference cell is connected to is discharged to a level that is midway between that of the case of a cell storing a high or a low. Each read bitline couples to a PMOS load device 65, which is always on. Alternatively, a PMOS device may be turned off when a read wordline RWL is selected.

An advantageous feature of this invention is that driving a WBL creates a coupling noise to both LRBLA and LRBLB by the same amount. Coupling between the WBL and the LRBLA and LRBLB is denoted by capacitor 62A, and coupling to the adjacent column is denoted by capacitor 62B. This is because half of the read line adjacent to WBL is LRBLA and the other half of the read line adjacent to WBL is LRBLB. This generates the common noise, making differential sensing possible.

This first method creates a common noise environment to maintain the differential signal, but the level of the coupling noise is not cancelled. Canceling of common mode level shift is important to avoid a sensing speed dependency on the data pattern. In addition, a WBL couples to all the cells in a column, resulting in a large capacitive write load.

Figure 7:
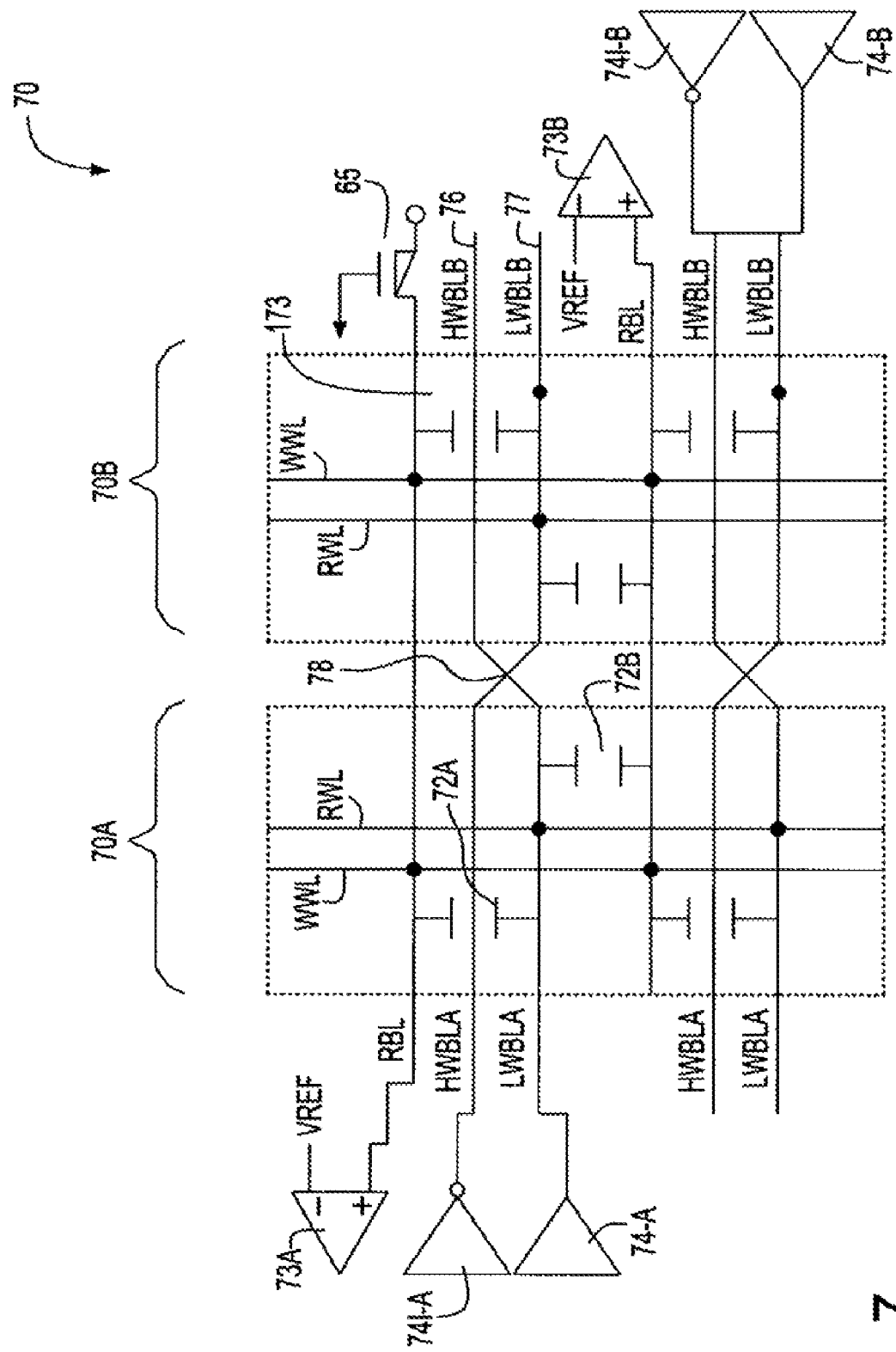
FIG. 7 shows an array with interleaved write bitlines for cancellation of common mode noise.

FIG. 7 shows a second method to overcome the problem described in the issued patent. A single memory array 70 comprises a plurality of 3T gain cells arranged in a matrix. However, other memory cells, which have a read and write port, may be used to configure a memory array. The single memory array 70 further is divided into two memory sections 70A and 70B.

Unlike the first embodiment, each RBL is extended into two memory sections 70A and 70B. They are directly coupled to the corresponding sense amplifier 73 together with the other input VREF. On the other hand, each WBL in a column is divided into two local WBL (LWBLA and LWBLB). Each memory section of the column further contains a hierarchical write bitline (HWBLA and HWBLB). The HWBLA and HWLBLB are arranged over the LWBLA and LWBLB in another metal layer. LWBLA and LWBLB are coupled to the HWBLB and HWBLA respectively by vertically twisting them at the twisting area 78. The LWBLA and HWBLB in a row 0 are coupled to write drivers 74A and 74IA located at the edge of the memory section A.

Similarly, the LWBLA and HWBLB in a row 1 are coupled to the write drivers 74B and 74IB located at the edge of the memory section B. This interleaved circuit arrangement makes it easy to accommodate the write driver circuitry. Optionally, both all drivers 74A, 74IA, 74B and 74IB may be arranged only at either A or B side (or without interleaving them). Similar to the write drivers 74, sense amplifiers 73A and 73B are arranged in an interleaving manner, with one input of the SA connected to (externally supplied) VREF. More particularly, the RBL in a row 0 and the RBL in a row 1 are coupled to the sense amplifiers 73A located at the A section and 73B located at the B section, respectively. Optionally, they may be arranged at either A or B side (or without interleaving them). Each read bitline is connected to a PMOS load device 65, which is always on. Alternatively, a PMOS device may be turned off when a read wordline RWL is selected.

An advantageous feature of this invention is that the write drivers 74 and 74I drive the corresponding HWBLA connecting to LWBLB through vertical twist 78 and drive LWLBLA connecting to HWLBLB in the opposite direction (with the opposite polarity). Thus the opposite polarity of the signals received in the adjacent RBL cancels the coupling noise to the adjacent RBL 173. This is because half of the adjacent RBL 173 is close to LWBLA and the other half of the adjacent RBL 173 is close to LWBLB, where LWBLA and LWBLB swing in the opposite direction. This allows the RBL sensing operation by utilizing a constant RBL reference voltage VREF. The VREF voltage is set to a half level when the RBL discharges when the high data bit would be read out from the memory cell. This second embodiment has the following two disadvantages over the previous embodiment. Firstly, the number of the cells coupling to the RBL is 2× of that for the first method, because one RBL supports all the column. In addition, the differential signal on the RBL pair depends on the speed of the HWBL swing, which may have a skew.

This invention overcomes the disadvantages of the first and second methods for multi-port memory by utilizing a three-dimensional twisted bitline architecture for both read and write bitline.

Figure 8:
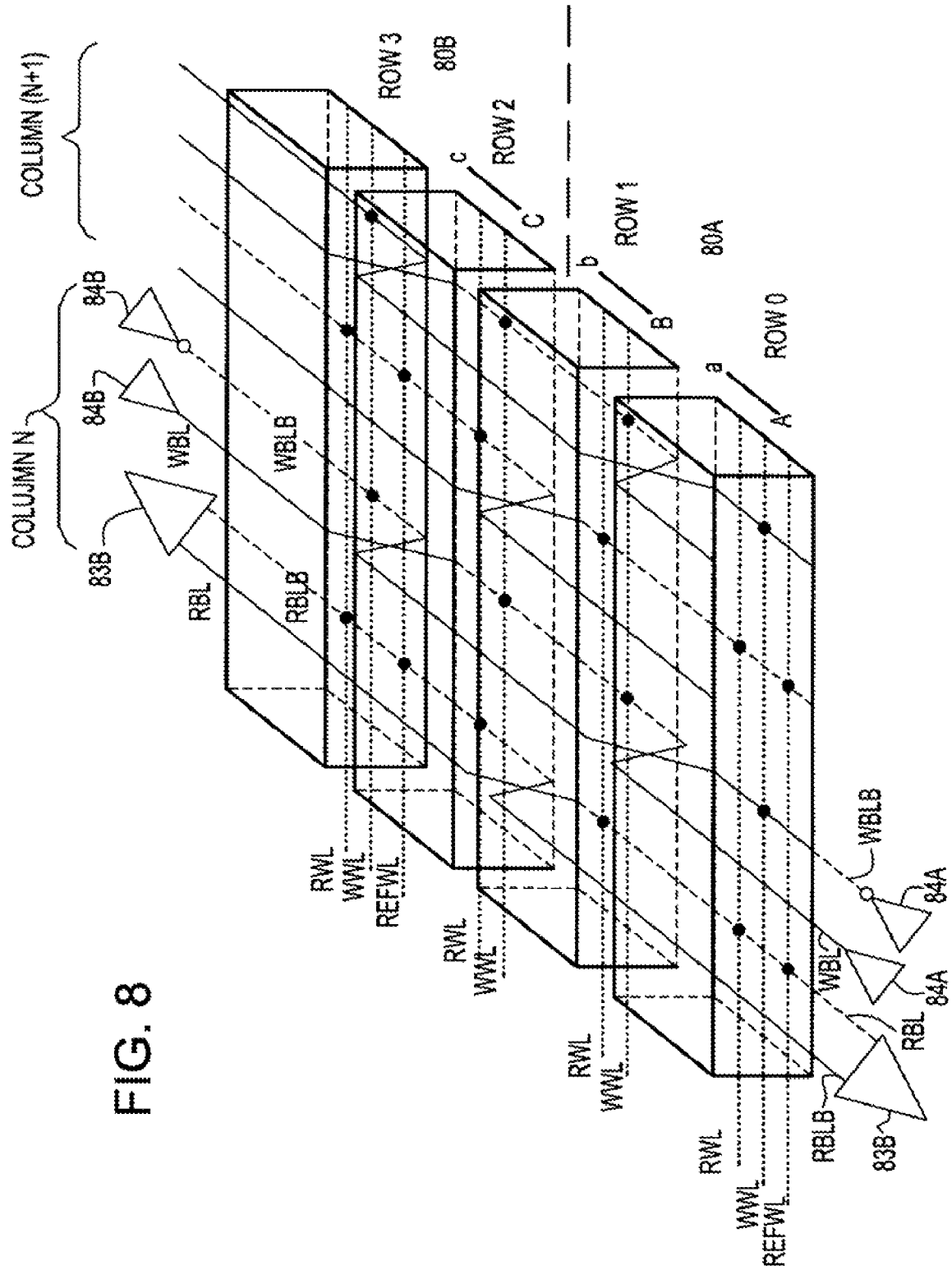
FIG. 8 shows an array according to the invention.

A three (3) dimensional twisted bitline architecture is shown in FIG. 8, where each column for both RBL and WBL Pair is divided into 4 segments as shown in FIG. 8. A section 80A of the memory array comprises rows 0 and 1 and a section 80B comprises the remaining rows 2 and 3. Each row has a Read Word Line RWL and a Write Word Line WWL. Rows 0 and 3 also have a Reference Word Line. REFWL that supplies the reference voltage to the sense amp to determine the data status of the accessed cell by RWL.

Figure 9:
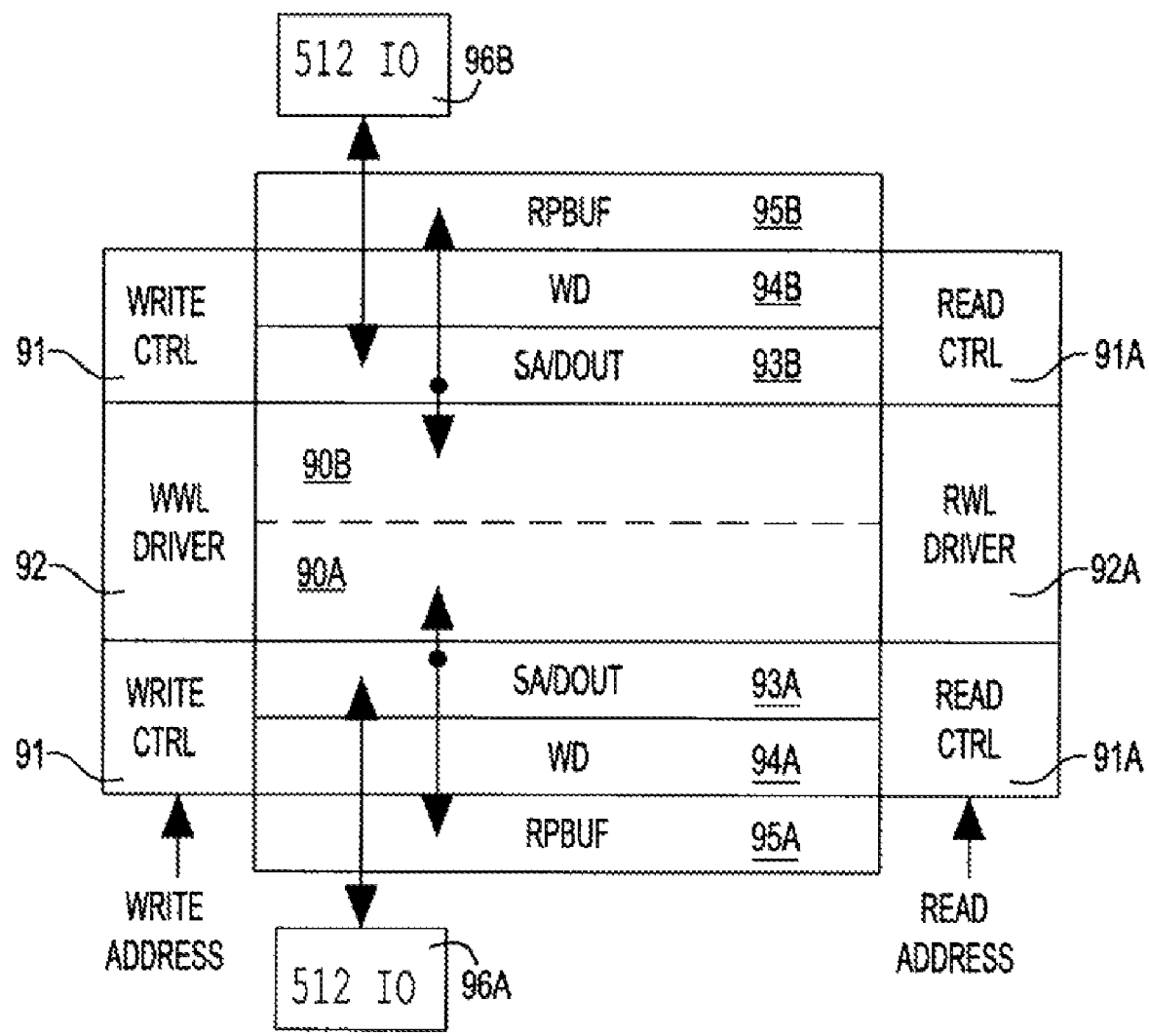
FIG. 9 shows a layout of an array.

On the left of the figure, Column N has corresponding peripheral circuits comprising: a) a sense amp 83B normally connected to RBLB and RBL and controllably connected by control means shown in FIG. 9 to the reference word line; and b) a pair of write bit line drivers 84B to drive WBL and WBLB. We need only a single side SA, write bit line driver for column N. The duplication of sense amplifiers and write bit line drivers is an option that provides reduced capacitance between the cells and the sense and the drivers.

The sense amplifiers and drivers are activated if the address of the cell to be read from or written to lies in the corresponding half of the array; i.e. if the cell to be read is in section 80B, the upper sense amp will be activated and the lower sense amp will be disabled. Similarly, for the write bit line drivers. A pair of drivers will be activated if the cell to be written to lies in the adjacent half of the array.

By using two levels of metal, true and complement read bitlines (RBL, RBLB) are formed by vertically twisting the read lines at a point between rows 1 and 2. The vertical connection may be implemented simply by a pair of vias. Similarly, the write bitlines (WBL and WBLB) are also vertically twisted at points between rows 0 and 1 and between rows 2 and 3. By twisting the RBLs, voltage coupled from an adjacent active WBL will appear as common mode noise on the RBL. Furthermore by providing complementary twisted write bitlines, rail-to-rail swings on the write bitlines result in minimal common mode voltage disturbance on the RBL. An array according to the invention thus has an arrangement of read bit lines to suppress the common mode noise and an arrangement of write bit lines to suppress the differential mode noise. As an example, the common mode noise on the read lines has been simulated to be as much as 0.25V in the embodiment of FIG. 6. The embodiment of FIG. 7 eliminates the noise level coupled to the read bit lines for the same parameters. Creating the common noise and canceling of the common noise level shift is important to avoid a sensing speed dependency on the data pattern. In addition, both RBL and WBL are coupled to half of the cells in the same column, resulting in a fast read and write operation.

FIG. 9 illustrates a layout of an array according to the invention. At the center, areas 92 and 92A contain WWL drivers and RWL drivers. Illustratively, area 90A contains columns in the lower half of the figure and area 90B contains corresponding columns in the upper half.

Areas 93A, 94A and 95A in the lower half of the figure contain peripheral circuits as described above, containing the sense amplifiers, write drivers and RPBUF that are located near the columns that they write to or read from. At the bottom, a set of I/O circuits 96A interface with off-chip portions of the system that the chip is part of. In this case, there are 512 columns in the block illustrated. The number of columns per block will vary with different designs. A corresponding set of areas 93B, 94B, 95B and 96B contain corresponding circuits for the upper half.

At the lower left, the write addresses come in from external sources and processed by the logic in write control 91, which recognize whether the write address is in the upper or lower half of the array and activate circuits accordingly. Similarly, the read addresses enter in the lower right and are processed by read control 91A. For example, if a read operation is to be performed in the lower half, the correct sense amp in the lower portion will be activated and the sense amp on the upper portion of that column will be disabled, so as to reduce the capacitive load during the read operation.

Figure 10:
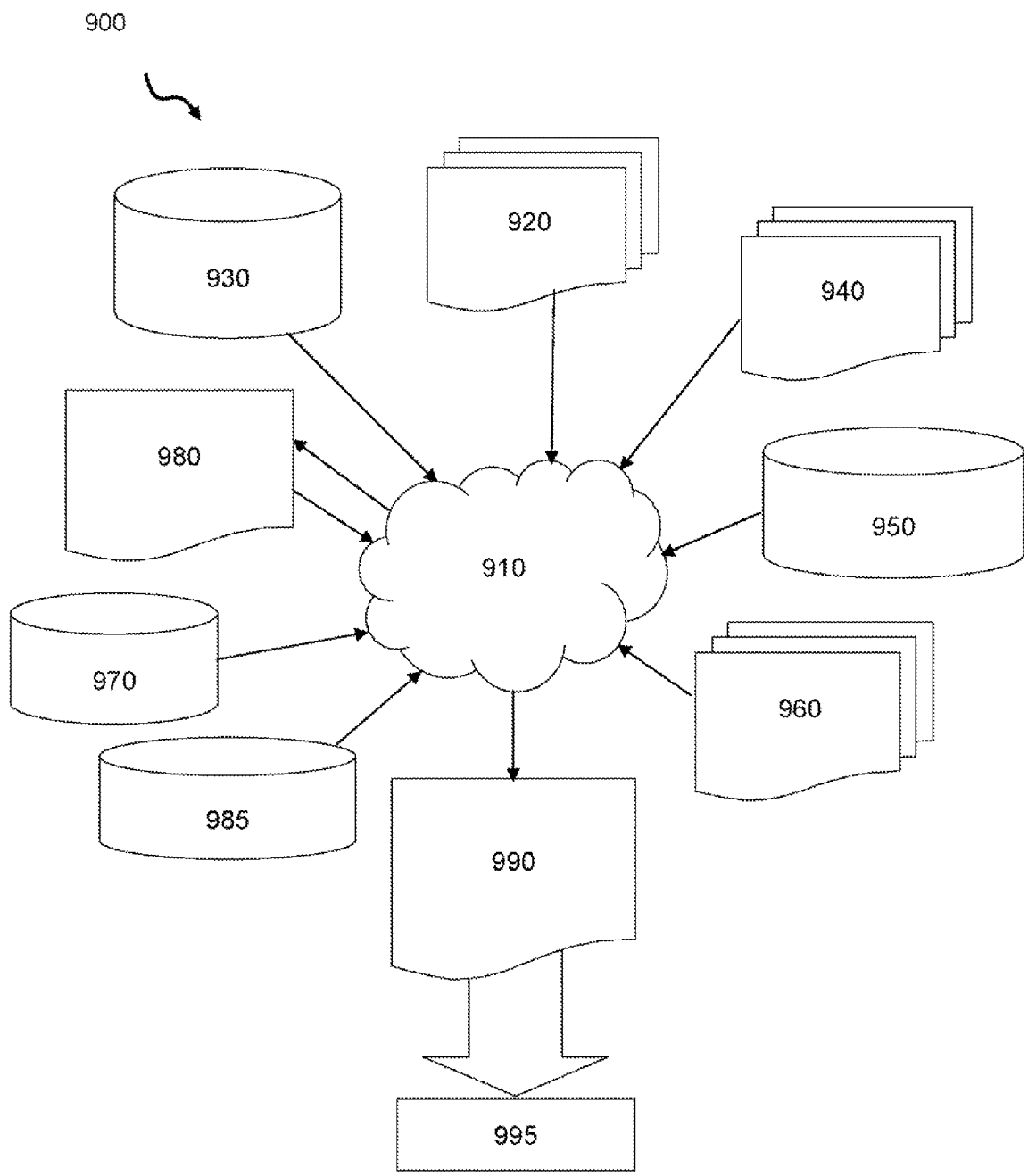
FIG. 10 is a flow diagram of a design process used in semiconductor design, manufacturing, and/or test.

FIG. 10 shows a block diagram of an example design flow 900. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises memory array 60 and/or memory array 70. Additionally, design structure 920 may include a three (3) dimensional twisted bitline architecture shown in FIG. 8 and/or the layout shown in FIG. 9. Design structure 920 may be in the form of schematics or HDL, a hardware-description language (e.g., Verilog, VHDL, C, etc.). Design structure 920 may be contained on one or more machine readable medium, which when implemented, may create memory arrays 60, 70, and/or the three (3) dimensional twisted bitline architecture shown in FIG. 8 and/or the layout shown in FIG. 9. For example, design structure 920 may be a text file or a graphical representation of memory arrays 60 and/or 70. Design process 910 preferably synthesizes (or translates) memory arrays 60 and/or 70 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 6, 7, 8, and 9, along with any additional integrated circuit design or data, into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 6, 7, 8, and 9. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of a single preferred embodiment, those skilled in the art will recognize that the invention can be practiced in various versions within the spirit and scope of the following claims.

What is claimed is:

1. A design structure embodied in a machine-readable medium used in a design process, the design structure comprising:
   an array of dual-port memory cells arranged in rows and columns, each cell being connected to a read word line and at least one read bit line and a write word line and at least one write bit line;
   a read circuit connected to said at least one read bit line and a driver circuit connected to said at least one write bit line; in which
   said at least one read bit line comprises two read bit lines disposed along columns in at least two sections of said memory array, said read lines in said at least two sections having opposite senses of reception of electromagnetic radiation, whereby said read circuit receives common mode noise from said at least one write bit line; and
   said at least one write bit line comprises two write bit lines disposed in at least two sections of said memory array, said at least two sections having opposite senses of transmission of electric current, whereby said read circuit receives a reduced differential mode noise from said write bit line.

2. The design structure of claim 1, in which said read bit lines are disposed at different vertical levels in said integrated circuit and alternate vertically in consecutive sections of a column in said array such that a first read bitline (rbl) is in an upper position in a first section while a second rbl is in a lower position in said first section and said first rbl is in said lower position in a second section while said second rbl is in said upper position in said second section, whereby said first and second rbls alternate vertical positions in consecutive sections along a column.

3. The design structure of claim 1, in which a first half of cells in a column are controllably connected to said first rbl and a second half of cells in said column are controllably connected to said second rbl.

4. The design structure of claim 2, in which a first half of cells in a column are controllably connected to said first rbl and a second half of cells in said column are controllably connected to said second rbl.

5. The design structure of claim 1 further comprising controllable means for connecting a reference voltage to said read circuit for comparison with the voltage on the read bit line connected to a selected cell, whereby the logic level of said selected cell is determined by comparison with said reference voltage.

6. The design structure of claim 2 further comprising controllable means for connecting a reference voltage to said read circuit for comparison with the voltage on the read bit line connected to a selected cell, whereby the logic level of said selected cell is determined by comparison with said reference voltage.

7. The design structure of claim 3 further comprising controllable means for connecting a reference voltage to said read circuit for comparison with the voltage on the read bit line connected to a selected cell, whereby the logic level of said selected cell is determined by comparison with said reference voltage.

8. The design structure of claim 4 further comprising controllable means for connecting a reference voltage to said read circuit for comparison with the voltage on the read bit line connected to a selected cell, whereby the logic level of said selected cell is determined by comparison with said reference voltage.

9. The design structure of claim 1, in which said write bit lines are disposed at different vertical levels in said integrated circuit and alternate vertically in consecutive sections of a column in said array such that a first write bitline (wbl) is in an upper position in a first section while a second wbl is in a lower position in said first section and said first wbl is in said lower position in a second section while said second wbl is in said upper position in said second section, whereby said first and second wbls alternate vertical positions in consecutive sections along a column.

10. The design structure of claim 1, in which a first half of cells in a column are controllably connected to said first wbl and a second half of cells in said column are controllably connected to said second wbl.

11. The design structure of claim 9, in which a first half of cells in a column are controllably connected to said first wbl and a second half of cells in said column are controllably connected to said second wbl.

12. The design structure of claim 1, further comprising a set of write drivers connected to both the first and second ends of the write bit lines of each column, and means for disabling those of said set of write drivers that are not connected to a selected cell, whereby each write driver has a reduced load.

13. The design structure of claim 9, further comprising a set of write drivers connected to both the first and second ends of the write bit lines of each column, and means for disabling those of said set of write drivers that are not connected to a selected cell, whereby each write driver has a reduced load.

14. The design structure of claim 1, further comprising a read circuit connected to both the first and second ends of the read bit lines of each column, and means for disabling the read circuit that is not connected to a selected cell, whereby each read circuit has a reduced capacitance on the input.

15. The design structure of claim 2, further comprising a read circuit connected to both the first and second ends of the read bit lines of each column, and means for disabling the read circuit that is not connected to a selected cell, whereby each read circuit has a reduced capacitance on the input.

16. A machine-readable medium having stored thereupon a design structure, the design structure comprising:
    an array of dual-port memory cells arranged in rows and columns, each cell being connected to a read word line and at least one read bit line and a write word line and at least one write bit line;
    a read circuit connected to said at least one read bit line and a driver circuit connected to said at least one write bit line; in which
    said at least one read bit line comprises two read bit lines disposed along columns in at least two sections of said memory array, said read lines in said at least two sections having opposite senses of reception of electromagnetic radiation, whereby said read circuit receives common mode noise from said at least one write bit line; and
    said at least one write bit line comprises two write bit lines disposed in at least two sections of said memory array, said at least two sections having opposite senses of transmission of electric current, whereby said read circuit receives a reduced differential mode noise from said write bit line.

17. The machine-readable medium of claim 16, in which said read bit lines are disposed at different vertical levels in said integrated circuit and alternate vertically in consecutive sections of a column in said array such that a first read bitline (rbl) is in an upper position in a first section while a second rbl is in a lower position in said first section and said first rbl is in said lower position in a second section while said second rbl is in said upper position in said second section, whereby said first and second rbls alternate vertical positions in consecutive sections along a column.

18. A machine-readable medium having stored thereupon a design structure including a netlist which, when being implemented, will create:
    an array of dual-port memory cells arranged in rows and columns, each cell being connected to a read word line and at least one read bit line and a write word line and at least one write bit line;
    a read circuit connected to said at least one read bit line and a driver circuit connected to said at least one write bit line; in which
    said at least one read bit line comprises two read bit lines disposed along columns in at least two sections of said memory array, said read lines in said at least two sections having opposite senses of reception of electromagnetic radiation, whereby said read circuit receives common mode noise from said at least one write bit line; and
    said at least one write bit line comprises two write bit lines disposed in at least two sections of said memory array, said at least two sections having opposite senses of transmission of electric current, whereby said read circuit receives a reduced differential mode noise from said write bit line.

19. The machine-readable medium of claim 18, wherein the design structure resides on the medium as a data format used for the exchange of layout data of integrated circuits.

20. The machine-readable medium of claim 18, wherein the design structure includes at least one of test data files, characterization data, verification data, or design specifications.

* * * * *